United States Patent [19]

Byrd

[11] Patent Number: 5,519,586
[45] Date of Patent: May 21, 1996

[54] FUSE HOLDER ASSEMBLY HAVING IMPROVED FUSE CLIPS FOR MOUNTING ON A PRINTED CIRCUIT BOARD

[75] Inventor: Timothy J. Byrd, Goffstown, N.H.

[73] Assignee: Modicon, Inc., North Andover, Mass.

[21] Appl. No.: 320,513

[22] Filed: Oct. 11, 1994

[51] Int. Cl.⁶ .................................................. H01H 85/20
[52] U.S. Cl. .......................... 361/833; 361/796; 361/835; 361/837; 439/621; 439/830
[58] Field of Search .................................. 361/752, 796, 361/801, 833, 630, 835, 837; 174/50; 439/621, 622, 259–270, 830–833, 78, 845, 849; 337/188, 201, 212, 213, 214, 209, 210

[56] References Cited

U.S. PATENT DOCUMENTS

| | | | |
|---|---|---|---|
| 5,113,168 | 5/1992 | Lindquist | 337/187 |
| 5,295,850 | 3/1994 | Jeffcoat et al. | 439/266 |
| 5,338,228 | 8/1994 | Wright, Jr. et al. | 439/621 |
| 5,391,098 | 2/1995 | Ohashi | 439/830 |

Primary Examiner—Leo P. Picard
Assistant Examiner—Y. Whang
Attorney, Agent, or Firm—Ware, Fressola, Van Der Sluys & Adolphson

[57] ABSTRACT

A fuse holder assembly (100) has a pair of fuse clips (23) which provide electrical connection between a fuse (22) and a circuit in a printed circuit board (15). The fuse holder assembly (100) securely holds a fuse (22) adjacent to an edge of the printed circuit board and in spaced relation to the printed circuit board (15) for easy access to the fuse and for maximizing the area on the printed circuit board available for circuit components or edge connector contacts. Each fuse clip (23) has a mounting base (25) for mounting to the printed circuit board and for providing electrical connection with the circuit on the printed circuit board, and a retention clip (33) attached to the mounting base. A support (55,58) supports the retention clip and provides access (53,70) to the retention clip for installation and removal of a fuse within the retention clip. The support (55,58) limits the movement of the retention clip with respect to the printed circuit board, while allowing resilient deformation of the clip for receiving and releasing a fuse.

16 Claims, 4 Drawing Sheets

FUSE HOLDER ASSEMBLY HAVING IMPROVED FUSE CLIPS FOR MOUNTING ON A PRINTED CIRCUIT BOARD

TECHNICAL FIELD

The present invention relates to a fuse holder, and more particularly, to a fuse holder assembly having a pair of fuse clips mounted on a printed circuit board.

1. Background of the Invention

It is well known to use fuses or other current interrupting devices to interrupt current flow to components mounted on a printed circuit board. Such current interrupting devices are primarily used to prevent over current damage to circuit components mounted on the printed circuit board and thereby prevent catastrophic failures during short circuit conditions, and prevent excessive heat build-up and possible smoke or fire damage.

2. Summary of the Invention

A primary object of the present invention is to provide an improved fuse holder assembly having a pair of fuse clips mounted on a printed circuit board, the fuse clips providing for the installation of a fuse within a circuit on the printed circuit board, and the fuse holder assembly providing for the easy installation and removal of fuses therein.

Another object of the invention is to provide a fuse holder assembly having a pair of fuse clips, the fuse holder assembly being part of a modular printed circuit board and housing, the fuse clips being mounted on the printed circuit board for providing electrical connection between a fuse and a circuit on the printed circuit board and for holding the fuse adjacent to an edge of the printed circuit board, and the fuse holder assembly minimizing stress and strain on soldered connections between the fuse clips and the printed circuit board in response to installation and removal of fuses.

A further object of the present invention is to provide an improved fuse holder assembly for use with a modular printed circuit board and housing which provides for easy inspection of fuses installed therein for determination of whether a fuse has failed.

A still further object of the present invention is to provide simplified, low cost fuse clips mounted on a printed circuit board which cooperate with a housing which houses the printed circuit board for providing a strong and secure fuse holder assembly for mounting fuses in the fuse clips.

Another object of the present invention is to provide a fuse holder assembly having a pair of fuse clips for electrical connection of a fuse to a circuit of a printed circuit board, the fuse clips holding the fuse in spaced relation to the printed circuit board for providing easy access to a fuse mounted in the fuse holder assembly, minimizing the area on the printed circuit board occupied by the fuse clips, and for maximizing the area on the printed circuit board for circuit components or edge connector contacts.

According to the present invention, a fuse holder assembly provides electrical connection between a fuse mounted in a pair fuse clips of the fuse holder assembly and a circuit on a printed circuit board, the fuse clips providing for the retention of a fuse adjacent to an edge of the printed circuit board and in spaced relation to the printed circuit board for maximizing the area on the printed circuit board available for circuit component installation or for edge connector contacts.

According further to the present invention, the fuse holder assembly includes a pair of fuse clips each having a mounting base for mounting to the printed circuit board and for providing electrical connection between each fuse clip and a circuit on the printed circuit board, each fuse clip also having retention means attached to the mounting base and having an electrical connection therewith, the retention means being configured for retaining an end of a fuse, the fuse holder assembly further including a support for supporting each of the retention means and for providing access to the retention means for installation and removal of a fuse within the retention means.

In further accord with the present invention, the support limits the movement of each of the fuse clips with respect to the printed circuit board, while allowing resilient deformation of the fuse clip retention means for receiving and releasing a fuse.

In still further accord with the present invention, the fuse clips and the support means cooperate for the secure retention of a fuse, and also provide access to a fuse installed therein for inspection, installation and removal.

According still further to the present invention, the mounting base of each fuse clip is configured for snap fit engagement to the printed circuit board for ease of manufacture during soldering of the mounting base to the printed circuit board.

The fuse holder assembly of the present invention provides a significant improvement over the prior art by allowing the installation of fuses within various circuits of a printed circuit board while minimizing the area on the printed circuit board occupied by a pair of fuse clips of the fuse holder assembly. The fuse clips hold a fuse adjacent to an edge of the printed circuit board and in spaced relation to the printed circuit board. Therefore, the area available on the printed circuit board for mounting circuit components or edge connector contacts is maximized. Additionally, the fuse holder assembly of the present invention provides access for the secure retention of a fuse within the fuse holder assembly, and easy access for viewing a fuse installed therein for determination of whether the fuse has failed. The fuse holder assembly of the present invention may be economically manufactured and assembled while providing improved utility.

The foregoing and other objects, features and advantages of the present invention will become more apparent in light of the following detailed description of exemplary embodiments thereof, as illustrated in the accompanying drawings.

BEST MODE FOR CARRYING OUT THE INVENTION

The fuse holder assembly of the present invention is particularly well suited for providing electrical connection of a fuse to a circuit of a printed circuit board while providing for the retention of the fuse adjacent to an edge of the printed circuit board and in spaced relation to the printed circuit board for maximizing the area on the printed circuit board available for mounting circuit components or edge connector contacts. Additionally, the fuse holder assembly provides for easy installation and removal of fuses therein and for the easy inspection of fuses for determination of whether a fuse has failed. The fuse holder assembly also provides for minimum force to be applied to electrical connections on a printed circuit board during installation or removal of a fuse to thereby prevent failure of such electrical connections.

Figure 1:
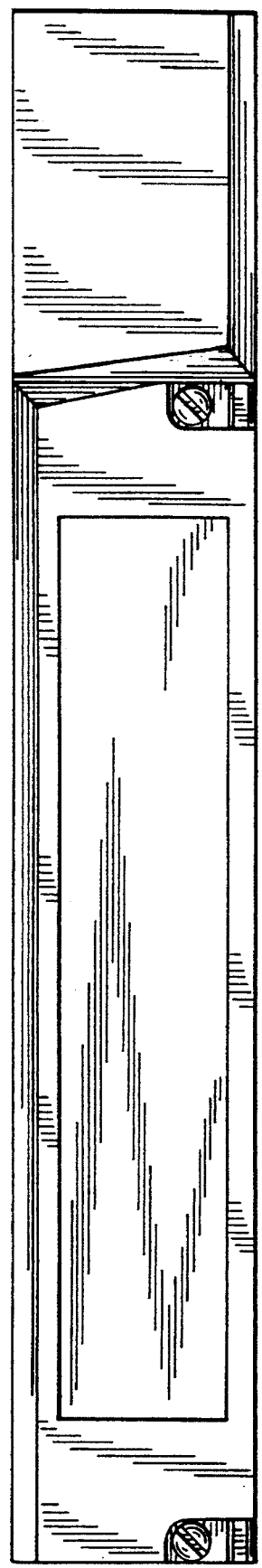
FIG. 1 is a front view of a housing containing the fuse holder assembly of the present invention.
Figure 3:
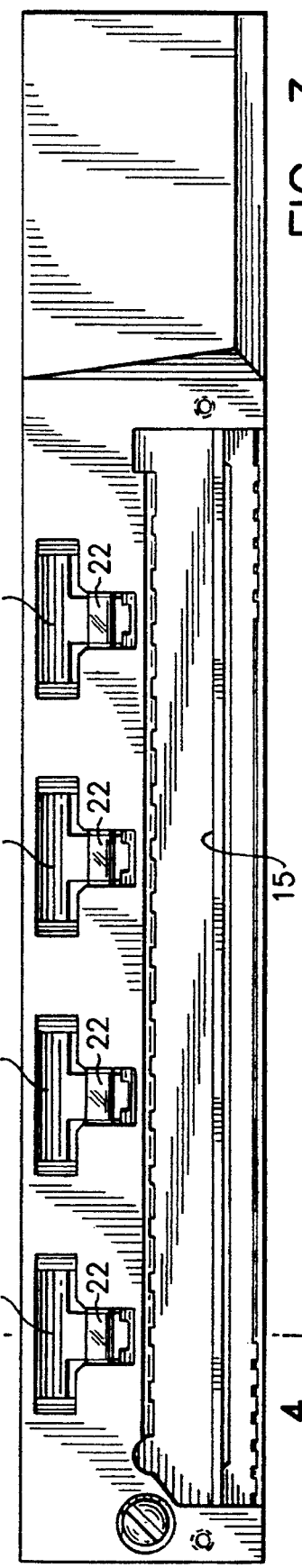
FIG. 3 is a front view of the housing of FIG. 1 showing the fuse holder cover and terminal connection module of FIG. 2 removed.
Figure 2:
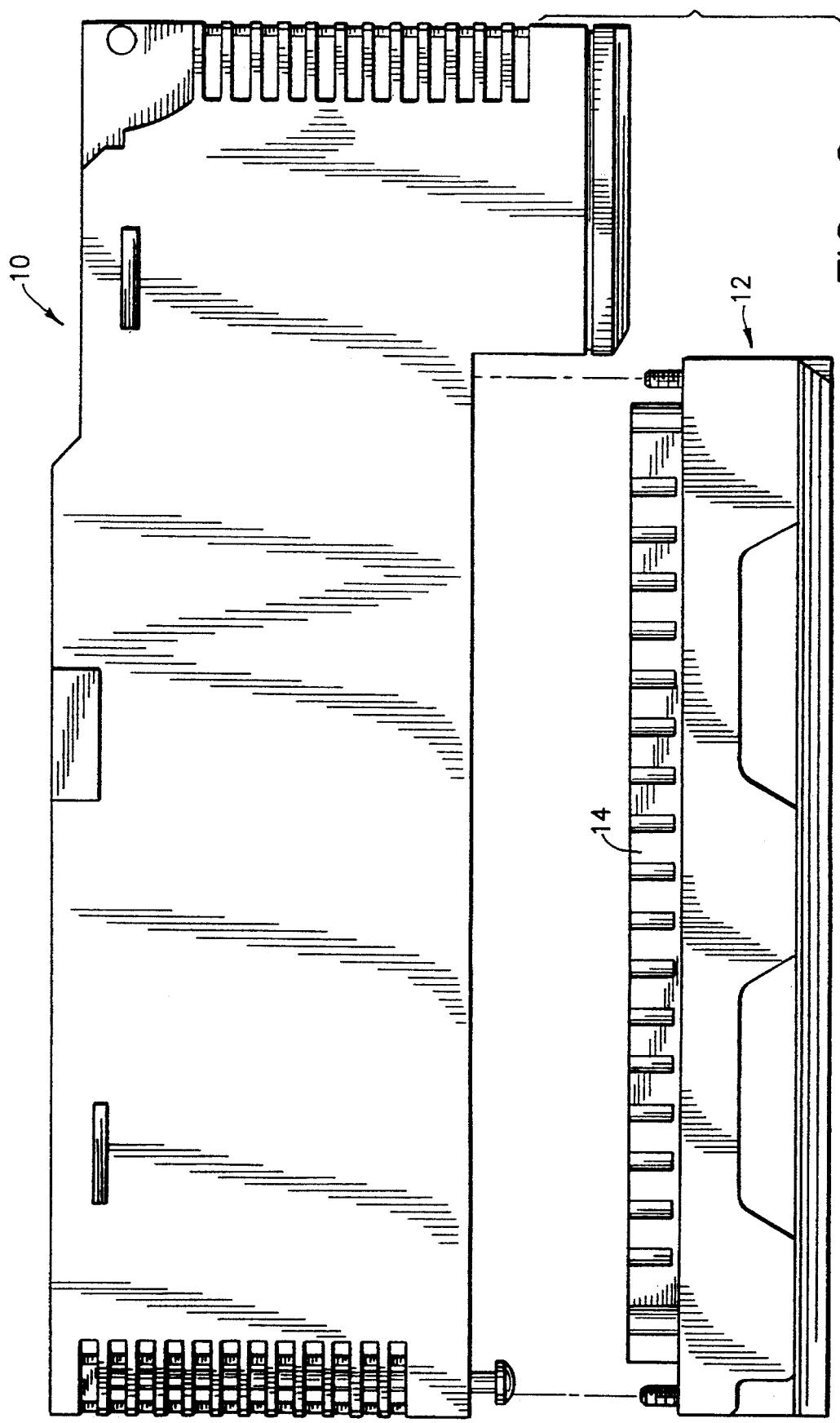
FIG. 2 is a top view of the housing of FIG. 1, showing a fuse holder cover and terminal connection module disassembled from the housing.
Figure 6:
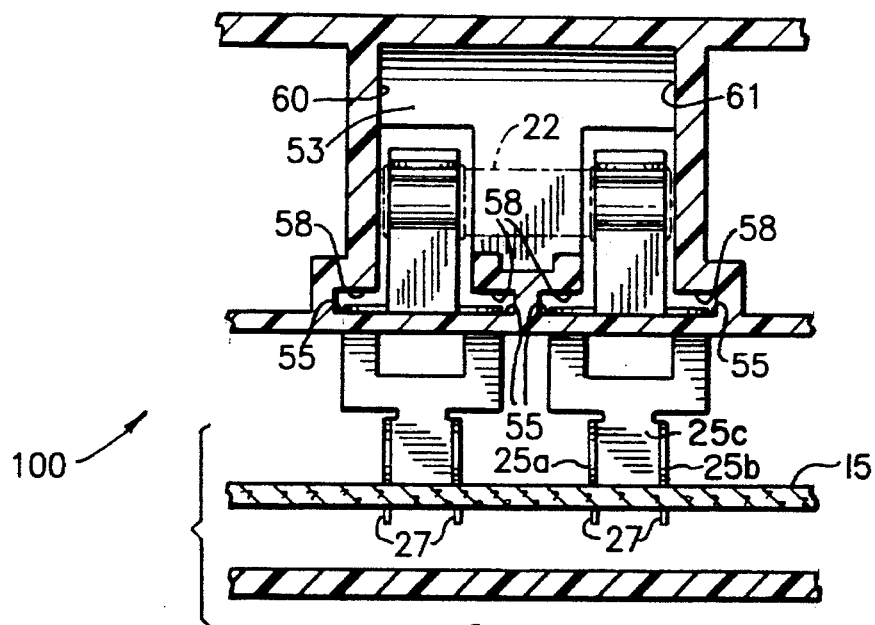
FIG. 6 is a cross-sectional view taken along line 6—6 of FIG. 4.

Referring to FIGS. 1 and 6, a fuse holder assembly 100 of the present invention is particularly well suited for use with a printed circuit board 15 mounted within a housing 10. Referring also to FIGS. 2 and 3, the housing 10 is provided with a terminal connection module 12 having a connector 14 for interconnection to a plurality of edge connector contacts (not shown) of a printed circuit board 15. As illustrated in FIG. 3, when the module 12 (FIG. 2) is removed from the housing 10, access is provided to a plurality of fuse holder assembly inspection and installation ports 20. In FIG. 3, the inspection and installation ports 20 are illustrated having fuses 22 mounted therein.

Referring to FIGS. 3, 4, 6 and 7, each fuse holder assembly 100 is provided with a pair of fuse clips 23. Each fuse clip 23 is mounted to the printed circuit board 15 by a mounting base 25. The mounting base 25 includes two side sections 25a, 25b which are oriented perpendicular to a center section 25c for secure mounting on the printed circuit board 15. Apertures (not shown) may be provided in the printed circuit board 15 for receiving contacts 27 of the mounting base 25 which provide electrical contact between the fuse clip 23 and the printed circuit board 15. For example, the electrical contacts 27 may be soldered to the printed circuit board 15 in the way known in the art. Alternatively, the mounting base may be provided without contacts 27. In this case, the mounting of the fuse clip 23 to the printed circuit board 15 may be accomplished by soldering the mounting base 25 directly in a circuit on the surface of the printed circuit board 15.

Figure 5:
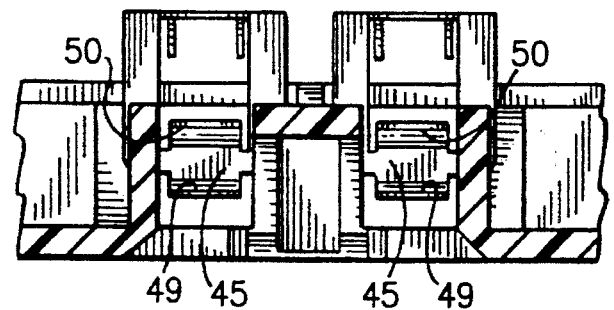
FIG. 5 is a cross-sectional view taken along line 5—5 of FIG. 4.
Figure 7:
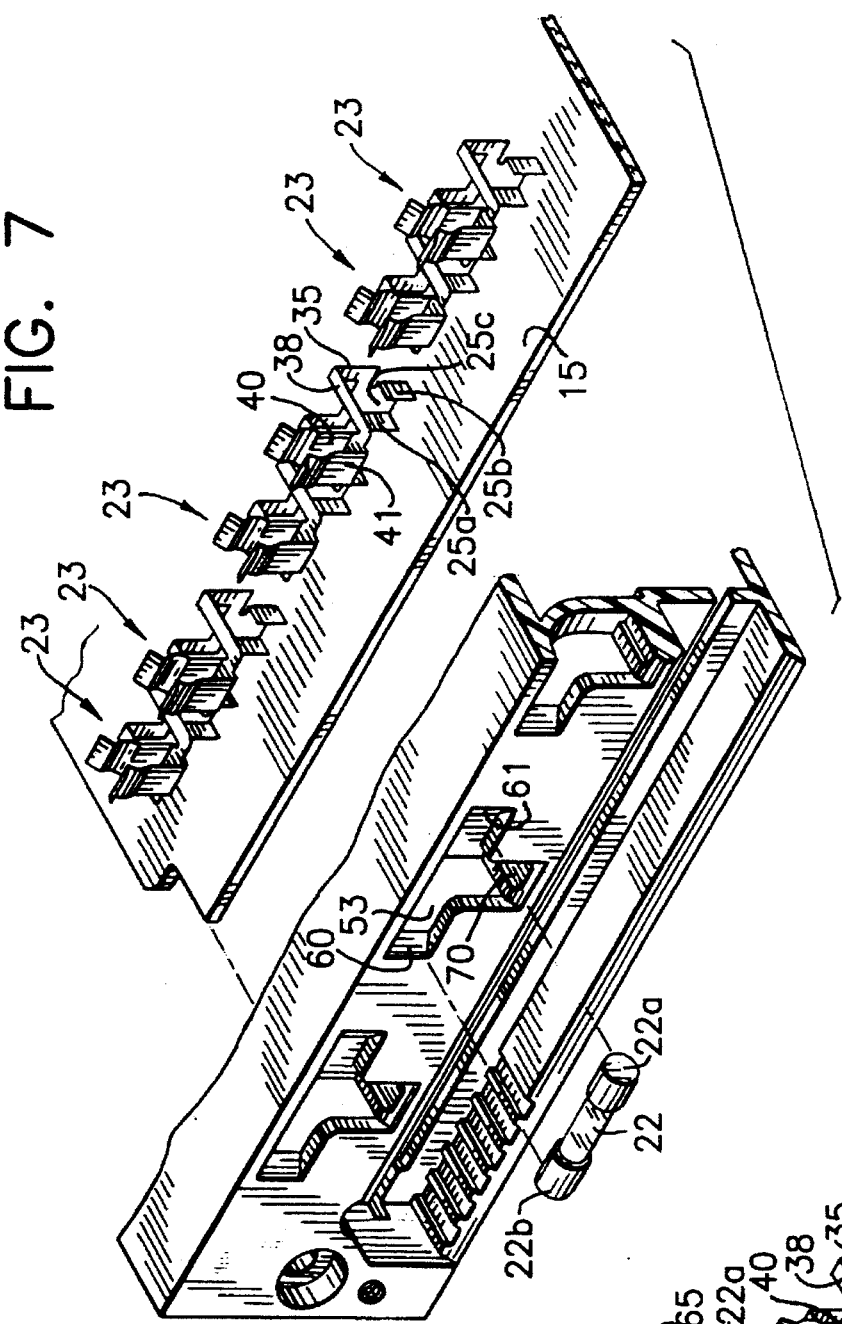
FIG. 7 is an exploded perspective view, partially broken away, of the housing of FIG. 3, showing a printed circuit board and fuse clips.
Figure 8:
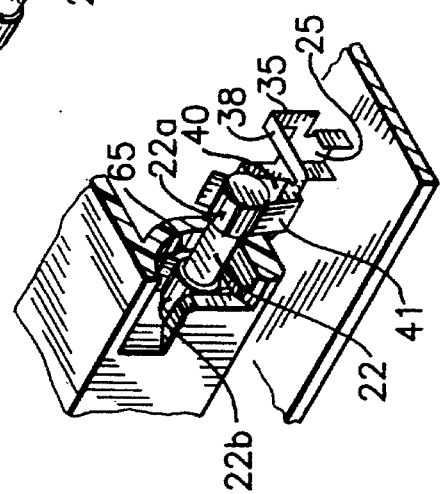
FIG. 8 is a perspective view, partially broken away, of the fuse holder assembly of FIG. 3, showing a fuse installed therein.

An extension arm 30 is attached to the mounting base 25 for supporting a retention clip 33. The extension arm 30 includes a first portion 35 which extends generally perpendicular to the surface of the printed circuit board 15 and a second portion 38 which extends generally parallel to the surface of the printed circuit board 15. The retention clip 33 includes a pair of resiliently deformable clip arms 40, 41 which extend generally perpendicular to the surface of the printed circuit board 15 and are in spaced relationship to one another. The retention clip arms 40,41 are formed so as to provide a generally circular shaped channel 45 for receiving an end 22a,22b (FIG. 7) of a fuse 22 (FIG. 7). The ends of each of the clip arms 40, 41 are provided with guide surfaces 49, 50. As illustrated in FIGS. 5 and 8, the guide surfaces 49, 50 are provided to guide the ends of a fuse 22a,22b into the channels 45 during insertion of a fuse 22 into the fuse holder assembly 100 (FIG. 7).

Figure 4:
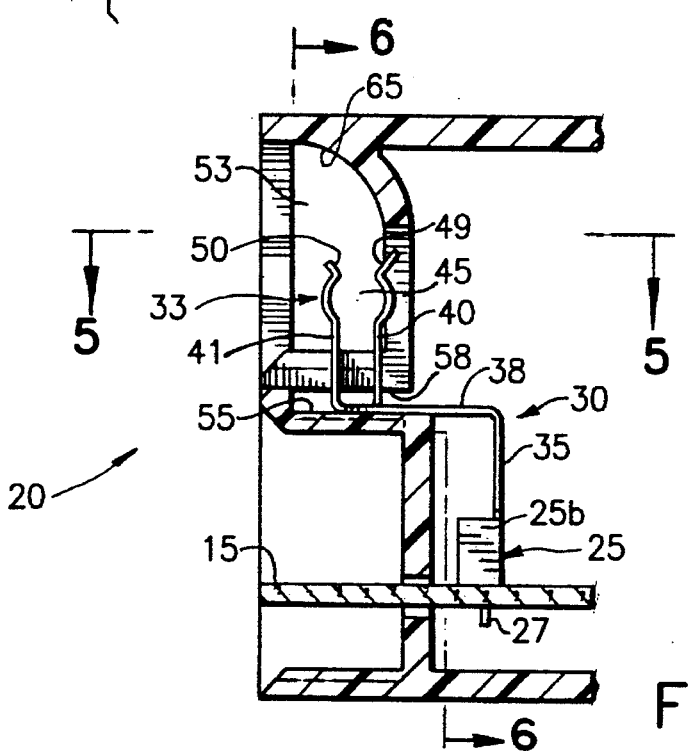
FIG. 4 is a cross-sectional view taken along line 4—4 of FIG. 3.

As described herein above, the housing 10 (FIG. 3) is provided with a plurality of inspection and installation ports 20. Referring to FIGS. 4, 6 and 7, each inspection and installation port 20 has an enclosure 53 formed therein for housing pairs of retention clips 33. Each of the enclosures 53 includes a first support surface 55 for supporting the second portion 38 of the extension arm 30. Therefore, during insertion of a fuse into the channels 45, the first supporting surface 55 supports the second portion 38 of the extension arm 30 so that the extension arm 30 does not flex or bend. The retention clip arms 40, 41 are free to spread apart in response to force applied to the guide surfaces 49, 50 so that the fuse may be received into the channels 45.

Each enclosure 53 also includes a second support surface 58, positioned parallel to the first support surface 55, with the second portion 38 of the extension arm 30 positioned therebetween. The second support surface 58 limits the movement or flexure of the extension arm 30 during removal of a fuse from the channel 45 of the retention clip 33. Therefore, the first and second support surfaces 55, 58 cooperate to limit the movement and flexure of the extension arm 30 in a direction towards or away from the printed circuit board 15, thereby minimizing fatigue failure of the extension arm 30 and minimizing the force applied to the solder joints between the electrical contacts 27 and the printed circuit board 15 so as to minimize failure thereof.

Referring to FIGS. 6, 7 and 8, the width of the enclosure 53 is slightly wider than the axial length of a fuse 22 received therein, and inside surfaces 60, 61 of the enclosure 53 cooperate to guide the fuse 22 into the channel 45 via the guide surfaces 49, 50. Additionally, the enclosure 53 is provided with a curved guide surface 65 (FIG. 4) for guiding a fuse placed into the enclosure 53 into the fuse clip guide surfaces 49, 50. Once a fuse is installed within the retention clip 33, the fuse may be easily inspected via inspection port 70 (FIG. 7) formed within housing 10 (FIG. 3) for determination of whether or not a fuse has failed.

Each fuse clip 23, including the electrical contact 27, the mounting base 25, the extension arm 30 and the retention clip 33, may be stamped from a single sheet of electrically conductive material, such as phosper bronze or berrylium copper. This configuration provides ease of manufacture of the fuse clip 23. The stamped sheet of material is thereafter bent at previously defined locations to provide the desired shape of the fuse clip 23 described hereinabove.

Although the invention is described herein as being used with a printed circuit board 15 mounted within a housing 10, the invention will function equally as well with a printed circuit board having a fixture attached to a side thereof which provides the enclosure 53 of the present invention. The enclosure 53 may be a molded thermo-plastic, and may be part of a back plane or housing in which the printed circuit board 15 is received or connected. All that is required is that the enclosures 53 and the printed circuit board 15 be held in fixed relationship to one another so that fuses may be installed in, and removed from, the retention clip 33.

Although the invention has been described with respect to exemplary embodiments thereof, it will be understood by those skilled in the art that the foregoing and various other changes, omissions and additions may be made therein and thereto without departing from the spirit and scope of the present invention.

What is claimed is:

1. A fuse holder assembly for electrical connection of a fuse to a circuit on a printed circuit board, comprising:

a pair of fuse clips, each fuse clip having a mounting base for mounting to the printed circuit board and for providing electrical connection with the circuit on the printed circuit board, and having retention means attached to said mounting base, said retention means having a resiliently deformable clip means formed therein for holding an end of a fuse, said mounting base and said retention means cooperating to hold an end of a fuse adjacent to an edge of the printed circuit board and in spaced relation to the printed circuit board; and support means for supporting said retention means and for providing access for the resilient deformation of said clip means for installation and removal of a fuse within said clip means.

2. A fuse holder assembly according to claim 1, further comprising a support arm for mounting said retention means to said mounting base.

3. A fuse holder assembly according to claim 2, wherein said support arm comprises a first portion which extends perpendicular to a surface of the printed circuit board and a second portion which extends parallel to the surface of the printed circuit board, said support arm being mounted by said first portion to said mounting base, and said retention means being mounted to said support arm second portion.

4. A fuse holder assembly according to claim 3, wherein said support means comprises a first support surface for preventing movement of said support arm second portion towards the printed circuit board and a second support surface for preventing movement of said support arm second portion away from the printed circuit board.

5. A fuse holder assembly according to claim 3, wherein said support means is an enclosure having a first support surface for preventing movement of said support arm second portion towards the printed circuit board and a second support surface for preventing movement of said support arm second portion away from the printed circuit board.

6. A fuse holder assembly according to claim 5, wherein said enclosure further comprises alignment surfaces for aligning the ends of a fuse with said retention means.

7. A fuse holder assembly according to claim 5, further comprising means for maintaining the printed circuit board and said enclosure in fixed relation to one another.

8. A fuse holder assembly according to claim 1, wherein said clip means is a pair of opposed retention clip arms forming a channel for retaining a fuse.

9. A fuse holder assembly according to claim 1, further comprising means for maintaining the printed circuit board and said support means in fixed relation to one another.

10. A fuse holder assembly according to claim 1, wherein said support means is a housing.

11. A fuse holder assembly according to claim 1, further comprising an inspection port formed in said support means for inspection of a fused mounted in said retention means.

12. A fuse clip for use in a fuse holder assembly for electrical connection of a fuse to a circuit on a printed circuit board, comprising:

a mounting base for mounting to the printed circuit board and for providing electrical connection with the circuit on the printed circuit board;

a support arm having a first end and a second end, said support arm being attach at said first end to said mounting base; and retention means attached to said support arm second end, said retention means having a resiliently deformable clip means formed therein for holding an end of a fuse, said mounting base, said support arm and said retention means cooperating to hold an end of a fuse in spaced relation to the printed circuit board.

13. A fuse clip according to claim 12, wherein said support arm comprises a first portion which extends perpendicular to a surface of the printed circuit board and a second portion which extends parallel to the surface of the printed circuit board, said support arm being mounted by said first portion to said mounting base, and said retention means being mounted to said support arm second portion.

14. A fuse clip according to claim 13, wherein the fuse holder assembly has a first support surface and a second support surface parallel to the first support surface, the first support surface preventing movement of said support arm second portion towards the printed circuit board and the second support surface preventing movement of said support arm second portion away from the printed circuit board.

15. A fuse clip according to claim 14, further comprising means for maintaining said retention means in fixed relation to the first and second support surfaces.

16. A fuse clip according to claim 13, wherein said clip means is a pair of opposed retention clip arms forming a channel for retaining a fuse.

* * * * *